(12) United States Patent
Yeh

(10) Patent No.: US 6,242,137 B1
(45) Date of Patent: Jun. 5, 2001

(54) METHOD TO UNI-DIRECTIONALLY EXPAND BANDWIDTH OF AN ASYMMETRIC OPTICAL SYSTEM

(75) Inventor: Chin-Teh Yeh, Hsinchu (TW)

(73) Assignees: ProMOS Technology, Inc; Mosel Vitelic Inc, both of Hsinchu (TW); Siemens AG, Munich (DE)

( * ) Notice: Subject to any disclaimer, the term of this patent is extended or adjusted under 35 U.S.C. 154(b) by 0 days.

(21) Appl. No.: 09/399,829

(22) Filed: Sep. 21, 1999

(51) Int. Cl.[7] .............................. G03F 9/00; G03B 27/42
(52) U.S. Cl. ............................................. 430/5; 355/53
(58) Field of Search ..................... 430/5, 322; 355/53, 355/55, 77; 385/37, 39

(56) References Cited

U.S. PATENT DOCUMENTS

| | | | |
|---|---|---|---|
| 5,600,743 | * | 2/1997 | Hilmer ................................... 385/37 |
| 6,057,065 | * | 5/2000 | Rolfson ................................... 430/5 |

* cited by examiner

*Primary Examiner*—S. Rosasco
(74) *Attorney, Agent, or Firm*—W. Wayne Liauh

(57) ABSTRACT

An optical mask system for improving the bandwidth in the x-direction of an asymmetrical optical mask, wherein the optical mask has a pattern that varies strongly in the x-direction, but slowly in the y-direction, thus occupying a two-dimensional cigar-shaped area in the transformed $F_x$–$F_y$ two-dimensional frequency domain. The apparatus and method of the present invention are most advantageous for preparing semiconductor devices whose topography varies strongly in one direction but weakly in another direction. The optical mask system includes: (a) a first diffractive light grating, tilted at a tilting angle $\omega$ relative to an incident light direction, wherein $\omega$ is about 45 degrees; (b) an asymmetric optical mask; (c) a second diffractive light grating, tilted at a tilting angle $\phi$ relative to the incident light direction, wherein $\phi$ is about 45 degrees; and (d) a low-pass filter. The light grating has a two-dimensional band-width that includes a major cluster and two minor clusters diagonally opposing each other. And the low-pass filter is a rectangular light passageway formed between two parallel plates.

18 Claims, 4 Drawing Sheets

METHOD TO UNI-DIRECTIONALLY EXPAND BANDWIDTH OF AN ASYMMETRIC OPTICAL SYSTEM

FIELD OF THE INVENTION

The present invention relates to an apparatus and method for uni-directionally improving the bandwidth of an asymmetrical optical mask system for use in photolithography operations. More specifically, the present invention relates to an apparatus and method for improving the bandwidth in the x-direction of an asymmetrical optical mask with a minimum sacrifice in the y-directional bandwidth, wherein the optical mask has a pattern that varies strongly in the x-direction, but weakly in the y-direction, thus occupying a cigar-shaped area in the transformed $F_x F_y$ two-dimensional frequency domain (or frequency plan). The apparatus and method of the present invention are most advantageous for preparing semiconductor devices whose topography varies strongly in one direction but weakly in another direction. The present invention also allows the dimension of the semiconductor devices to be reduced, while still maintaining the desired resolution, and without incurring large capital investments.

BACKGROUND OF THE INVENTION

In photolithography operations which are important steps in the fabrication of semiconductor devices, optical masks are used typically to pattern a photoresist layer. With the design of semiconductor devices becoming increasingly more complicated in design and finer in dimensions, we are also seeing a trend of more radical departure in their layouts from the traditional, and more or less, symmetric, design. It has become not-all-too-uncommon to have semiconductor wafer layouts, and thus the associated optical masks, that involve strong variations in the first direction (say, x-direction), but relatively slow variations in the second direction (say, y-direction), creating an asymmetric optical mask system.

In a typical masked photo exposure operation, a coherent light (typically a KrF laser light passed through a condensing lens) is emitted upon the optical mask at an inclined angle. Two high frequency light beams and one direct light beam will be generated as a result of diffraction from the optical mask. The direct light beam is a relatively low frequency 0th-order diffracted light and the two relatively high frequency high beams are 1st-order diffracted light beams. When the diffraction angle exceeds a certain value, the high frequency portion of the light beams may be diffracted outside the area of the objective lens disposed behind the optical mask, resulting in a substantial loss in the optical resolution, particularly in the x-direction, where variations are stronger. (It should be noted that designation of x- and y-directions are only arbitrary.) This can adversely affect the precision and sometimes the acceptability of the resultant semiconductor device.

In other words, because of the asymmetry in the variations of the pattern of the optical mask between the x- and y-directions, different bandwidths exist, and the pertinent bandwidths (i.e., the two-dimensional bandwidth distribution) occupy a two-dimensional cigar-shaped area in the transformed $F_x$–$F_y$ frequency domain as shown in FIG. 1. As a result, in order to improve semiconductor quality and maintain good production yield, it is important to research various ways that may reduce the asymmetry of the frequency domain.

SUMMARY OF THE INVENTION

The primary object of the present invention is to develop an apparatus and method that will improve the performance, i.e., overall bandwidth, of an optical mask system having a substantial degree of optical asymmetry. More specifically, the primary object of the present invention is to improve the bandwidth in the x-direction of an asymmetrical optical mask by sacrificing the y-directional bandwidth, wherein the optical mask system has a distinctive two-dimensional pattern that varies strongly in the x-direction, but only slowly in the y-direction, thus occupying (i.e., being represented by) a cigar-shaped area in the frequency domain (i.e., a graphical representation of the two-dimensional bandwidths), as shown in FIG. 1. In FIG. 1, $F_x$ indicates the transformed frequency function in the x-direction, transformed $F_y$ indicates the frequency function in the y-direction, and the shaded cigar-shaped area indicates the asymmetrical two-dimensional bandwidths in the transformed $F_x$- and $F_y$-directions.

In the optical mask system disclosed in the present invention, a diffractional grating is placed before the optical mask. The diffractional grating is tilted at a predetermined angle $\omega$ wherein $\omega$ is about 30–60° from the x-axis (i.e., the axis corresponding to the axis of strong variations). The tilted diffractional grating has a frequency domain as shown in FIG. 2 which comprises a main distribution, or cluster, as represented by a circle, at the center and two minor clusters (represented by two minor circles) diagonally opposing each other and at an angle $\omega$ relative to the x-axis. The signal, or the incident light, is convoluted between the tilted diffractional grating and the optical mask in the frequency plan, and the bandwidth of the convoluted spectrum will comprise the original cigar-shaped area, plus two identical clones respectively centered at the two minor circles.

The convoluted spectrum then passes through a pupil, which, in a preferred embodiment, comprises a pair of optical lenses. Because the bandwidth of the incident light is wider in the x-direction, the pupil does not affect the y-directional bandwidth. The filtered signal then passes through another diffractional grating tilted at a predetermined angle $\phi$ wherein $\phi$ is about 30–60° from the x-axis. Finally, a horizontal slit is provided to remove the extraneous frequency components that do not belong to the object spectrum. The result is an output image whose spectrum has a substantially broader bandwidth in the $F_x$-direction.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an apparatus and method that will improve the overall bandwidths of an optical mask system having a significant extent asymmetry (or variation) in its bandwidths in x- and y-directions due to the fact that the optical mask has a distinctive two-dimensional pattern that varies strongly in one direction (e.g., the x-direction), but slowly in another direction (the y-direction), thus occupying a cigar-shaped area in the two-dimensional frequency domain (or frequency plan).

Figure 1:
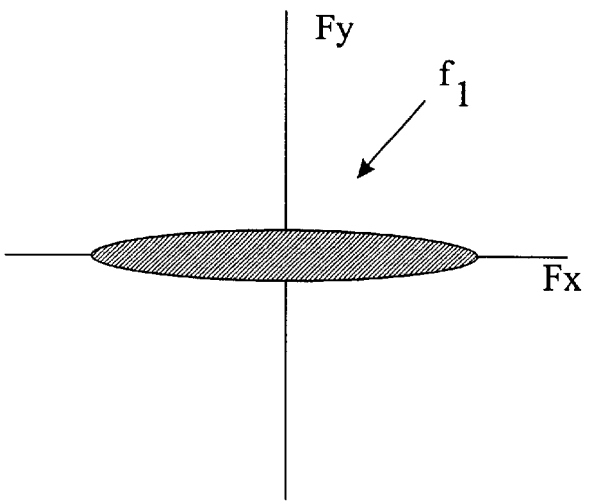
FIG. 1 is an illustrative drawing showing a cigar-shaped two-dimensional bandwidth distribution in the $F_x$–$F_y$ frequency domain which represents the two-dimensional bandwidths associated with a conventional asymmetric optical mask.

FIG. 1 is an illustrative drawing showing a cigar-shaped area $f_1$ which represents the two-dimensional bandwidth distribution associated with a conventional asymmetric optical mask. In FIG. 1, $F_x$ and $F_y$ represent the transformed coordinates in the two-dimensional frequency domain in accordance with Fourier transformation operations:

$$G(Fx,Fy)=F\{g(x,y)\}=\int\int g(x,y)\exp[-j2\pi(Fx\cdot x+Fy\cdot y)]dxdy$$

This transformation operation is well known in the art and its discussion will not be duplicated in this disclosure. The important matter is that, due to the asymmetry in the degree of variations between the x- and y-directions, the optical mask is represented with a cigar-shaped two-dimensional bandwidth distribution in the $F_x$–$F_y$ frequency domain. In order to improve the semiconductor quality and maintain good production yield, it is important to improve the optical mask system so as to enhance the bandwidth in strongly-varying direction (in FIG. 1, the $F_x$-direction).

Figure 2:
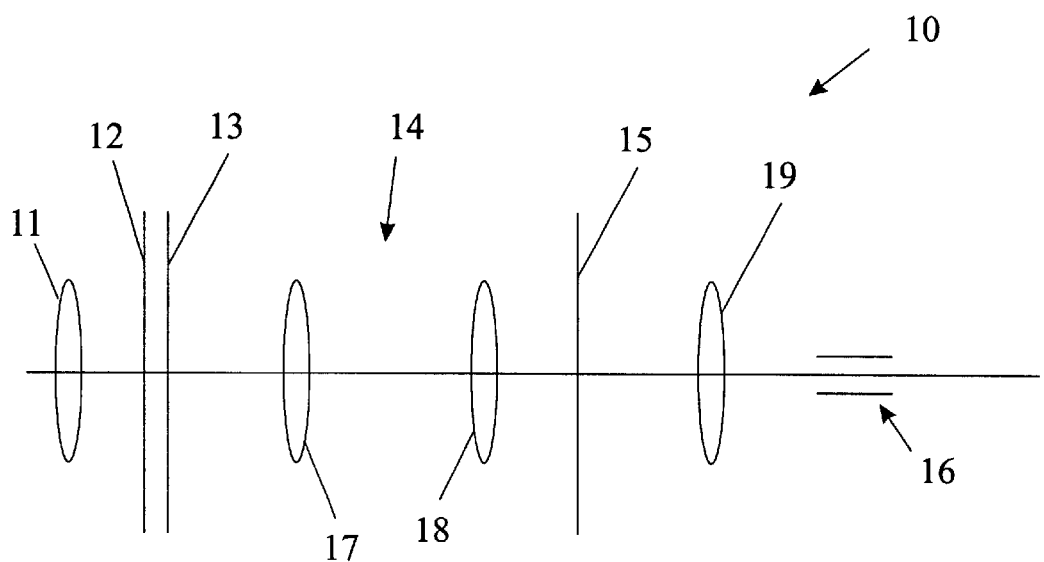
FIG. 2 is an illustrative schematic drawing showing the improved optical mask assembly according to a preferred embodiment of the present invention.

In the present invention, a diffractional grating is placed before the optical mask. The diffractional grating is tilted at a predetermined angle ω with respect to the x-axis, wherein ω is about 30–60°. The tilted diffractional grating has a two-dimensional bandwidth distribution in the $F_x$–$F_y$ frequency domain as shown in FIG. 2 which comprises a main cluster (represented by a circle) at the center and two minor clusters (represented by two circles, respectively) diagonally opposing each other and at an angle ω relative to the x-axis. The signal, or incident light, is convoluted between the tilted diffractional grating and the optical mask in the frequency plan, and the bandwidth of the convoluted spectrum will comprise the original cigar-shaped area in the frequency domain, plus two identical clones respectively centered at the two minor clusters.

The convoluted spectrum then passes through a pupil, which comprises a pair of condenser lenses. Because the bandwidth of the incident light is wider in the x-direction, the filter does not affect the y-directional bandwidth. The filtered light then passes through another diffractional grating tilted at a predetermined angle ϕ, wherein ϕ is about 30–60° from the x-axis. Finally, a horizontal slit is provided to remove the extraneous frequency components that do not belong to the object spectrum. The result is an output image whose spectrum has a substantially broader bandwidth in the Fx-direction.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIG. 2 is an illustrative schematic drawing showing the improved optical mask system 10 according to a preferred embodiment of the present invention. The optical mask system 10 includes, in the order from the light source, a first condenser lens 11, a first diffractional grating 12, an optical mask 13, a pupil 14, a second diffractional grating 15, and a low pass filter 16. The pupil 14 contains a pair of lenses 17, 18. The low pass filter 16 is a rectangular passageway formed between two parallel plates. FIG. 2 also shows that a condenser lens 19 is provided between the second diffractional grating 15 and the low pass filter 16.

Figure 3:
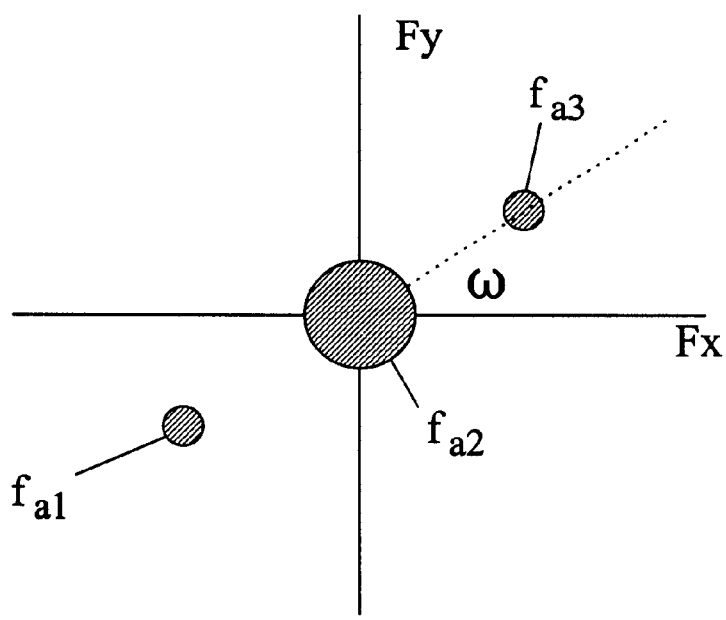
FIG. 3 is an illustrative drawing showing the two-dimensional bandwidth distribution in the $F_x$–$F_y$ frequency domain associated with a diffractive grating tilted at an $\omega$ angle respective to the long axis.

FIG. 3 is an illustrative drawing showing the 2-dimensional bandwidth distribution in the $F_x$–$F_y$ frequency domain associated with the first diffractive grating tilted at an angle ω of about 45 degrees relative to the x-axis. The diffractive grating has a spacing d which is determined by the following equation:

$$d \approx \lambda\left(\frac{1}{B}\right)$$

where: d is the grating spacing

λ is the wavelength of the incident light

B is the bandwidth of the grating

Figure 4:
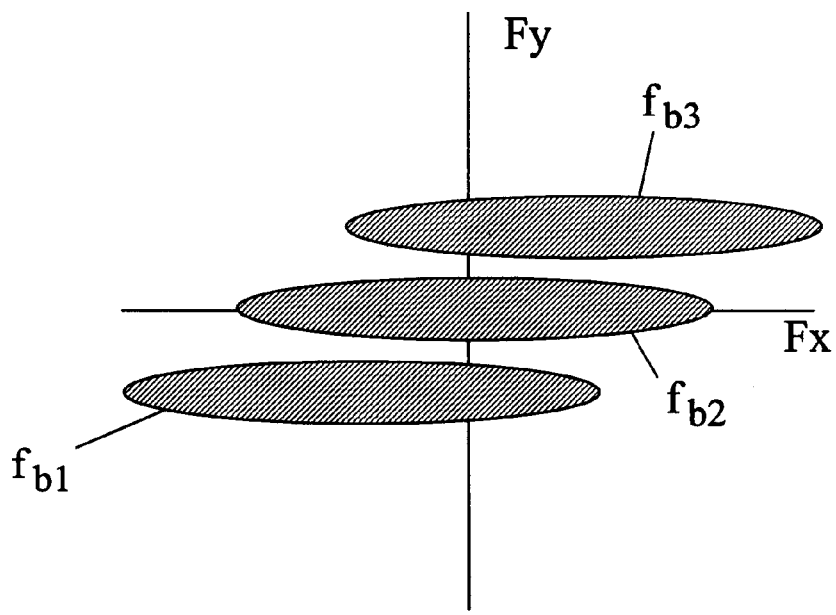
FIG. 4 is an illustrative drawing showing the two-dimensional bandwidth distribution in the $F_x$–$F_y$ frequency domain associated with the convoluted spectrum after the incident light passes through the diffractive grating and an optical mask.

The bandwidth area associated with the tilted first diffractive grating comprises a main cluster $f_{a2}$ at the center (represented by a circle), and two minor clusters (represented by two respective circles), $f_{a1}$ and $f_{a3}$, diagonally opposing each other and at an angle ω relative to the x-axis (which is the same as the $F_x$ axis). FIG. 4 is an illustrative drawing showing the 2-dimensional bandwidth distribution in the $F_x$–$F_y$ frequency domain associated with the convoluted spectrum after the incident light passes through the diffractive grating and an optical mask. Signals in the incident light are convoluted between the tilted diffractional grating and the optical mask, and the bandwidth of the convoluted spectrum comprises the original cigar-shaped frequency domain, $f_{b2}$ plus two identical clones, $f_{b1}$ and $f_{b3}$, respectively centered at the locations corresponding respectively to the two minor clusters $f_{a1}$ and $f_{a3}$.

Figure 5:
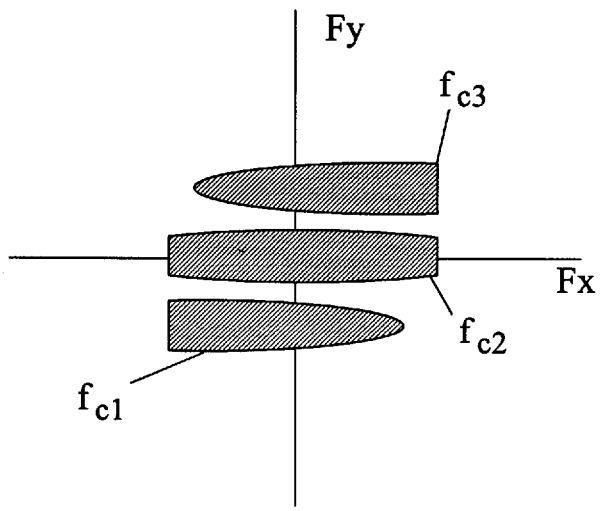
FIG. 5 is an illustrative drawing showing the two-dimensional bandwidth distribution in the $F_x$–$F_y$ frequency domain after the incident light passes through a low pass filter, which comprises a pair of lenses.

The convoluted spectrum then passes through a pupil, which comprises a pair of condenser lenses. Because the cigar-shaped area representing the incident light is wider in the $F_x$-direction, the filter does not affect the $F_y$-directional bandwidth. However, it reduces the bandwidth in the $F_x$-direction. FIG. 5 is an illustrative drawing showing the resultant bandwidth distribution, which comprises a stack of three partial cigar-shaped areas, $f_{c1}$, $f_{c2}$, and $f_{b3}$, which are substantially aligned vertically along the $F_y$-axis.

Figure 6:
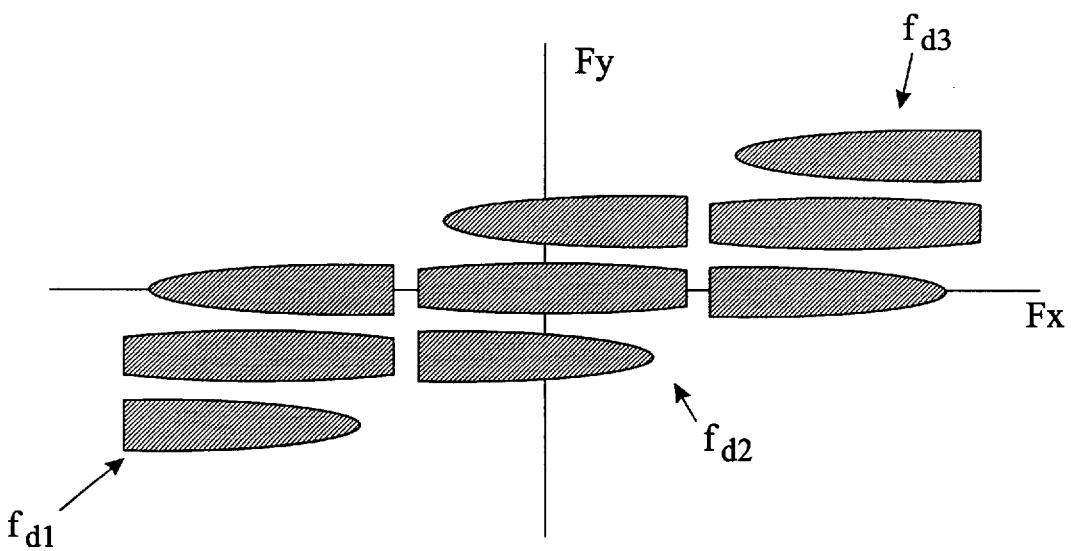
FIG. 6 is an illustrative drawing showing the two-dimensional bandwidth distribution in the $F_x$–$F_y$ frequency domain after the incident light passes through another tilted grating.

The filtered light then passes through another diffractional grating tilted at a predetermined angle ϕ, wherein ϕ is about 45° from the x-axis. FIG. 6 is an illustrative drawing showing the 2-dimensional bandwidth distribution in the $F_x$–$F_y$ frequency domain after the incident light passes through another tilted grating. It contains a center stacked cigar $f_{d2}$, and two diagnostically opposed stacked cigars $f_{d1}$, $f_{d3}$, at an angle φ with respect to the $F_x$ axis.

Figure 7:
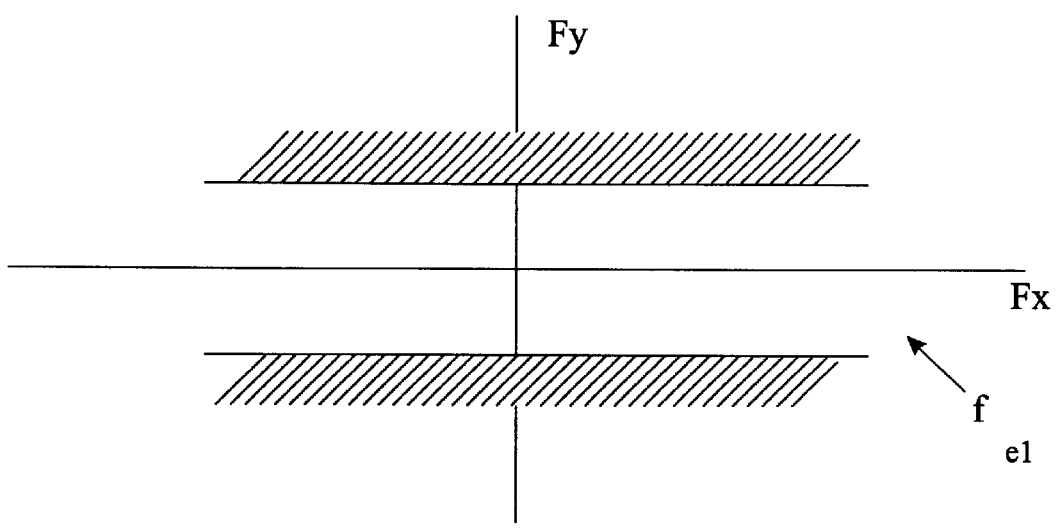
FIG. 7 is an illustrative drawing showing the final improved two-dimensional bandwidth distribution in the $F_x$–$F_y$ frequency domain after the incident light passes through a horizontal slit to remove the extraneous frequency components that do not belong to the object spectrum.

FIG. 7 is an illustrative drawing showing the final improved 2-dimensional bandwidth distribution in the $F_x$–$F_y$ frequency domain $f_{e1}$ after the incident light passes through a horizontal slit to remove the extraneous frequency components that do not belong to the object spectrum. FIG. 7 shows that the bandwidth in the $F_x$ direction is substantially enhanced, compared to the narrow cigar-shaped 2-dimensional bandwidth distribution as shown in FIG. 1.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An optical mask system comprising, in an order away from a light source:
   (a) a first diffractive light grating, tilted at a tilting angle ω relative to a first direction, wherein ω is between about 30 and 60 degrees;
   (b) an optical mask, having a pattern which has a greater degree of pattern variations in said first direction than in a second direction, wherein said second direction is perpendicular to said first direction;
   (c) a second diffractive light grating, tilted at a tilting angle φ relative to said first direction, wherein φ is between about 30 and 60 degrees;
   (d) a condenser lens; and
   (e) a low-pass filter.

2. The optical mask system according to claim 1 which further comprises a pupil disposed between said optical mask and said second diffractive light grating.

3. The optical mask system according to claim 2 wherein said pupil comprises a pair of condenser lenses.

4. The optical mask system according to claim 1 wherein said tilting angles ω and φ are both about 45 degrees.

5. The optical mask system according to claim 1 wherein said low pass filter is an rectangular light passageway formed between two parallel plates.

6. The optical mask system according to claim 1 wherein said first or second light grating has a grating spacing d, which is determined according to the following equation:

$$d \approx \lambda\left(\frac{1}{B}\right)$$

where:
   d is the grating spacing,
   λ is the wavelength of the incident light, and
   B is the bandwidth of the grating.

7. The optical mask system according to claim 1 wherein said optical mask has a cigar-shaped two-dimensional bandwidth distribution in a Fourier transformed frequency domain.

8. The optical mask system according to claim 1 wherein said first or second light grating has a bandwidth distribution consisting of a major cluster and two diagonally opposed minor clusters relative to said major circle.

9. The optical mask system according to claim 8 wherein:
   (a) said optical mask has a cigar-shaped two-dimensional bandwidth distribution in a Fourier transformed frequency domain;
   (b) said first grating has a bandwidth distribution consisting of a major cluster and two diagonally opposed minor clusters relative to said major circle in said Fourier transformed frequency domain, and
   (c) said first grating and optical mask are structured such that an incident light is convoluted between said first grating and said optical mask and the bandwidth of the convoluted spectrum comprises one said cigar-shaped distribution, plus two identical clones respectively centered at said two minor clusters.

10. A method for photolithographically developing a photoresist comprising the step of irradiating a light source through an optical mask assembly, wherein said optical mask system comprises, in an order away from a light source:
   (a) a first diffractive light grating, tilted at a tilting angle ω relative to a first direction, wherein ω is between about 30 and 60 degrees;
   (b) an optical mask, having a pattern which has a greater degree of pattern variations in said first direction than in a second direction, wherein said second direction is perpendicular to said first direction;
   (c) a second diffractive light grating, tilted at a tilting angle φ relative to said incident light direction, wherein φ is between about 30 and 60 degrees;
   (d) a condenser lens; and
   (e) a low-pass filter.

11. The method for photolithographically developing a photoresist according to claim 10 wherein said optical mask system which further comprises a pupil disposed between said optical mask and said second diffractive light grating.

12. The method for photolithographically developing a photoresist according to claim 11 wherein said pupil comprises a pair of condenser lenses.

13. The method for lithographically developing a photoresist according to claim 10 wherein said tilting angles ω and φ are both about 45 degrees.

14. The method for photolithographically developing a photoresist according to claim 10 wherein said low pass filter is an rectangular light passageway formed between two parallel plates.

15. The method for photolithographically developing a photoresist according to claim 10 wherein said first or second light grating has a grating spacing d, which is determined according to the following equation:

$$d \approx \lambda\left(\frac{1}{B}\right)$$

where:
   d is the grating spacing,
   λ is the wavelength of the incident light, and
   B is the bandwidth of the grating.

16. The method for photolithographically developing a photoresist according to claim 10 wherein said optical mask has a cigar-shaped two-dimensional bandwidth distribution in a Fourier transformed frequency domain.

17. The method for photolithographically developing a photoresist according to claim 10 wherein said first or second light grating has a bandwidth distribution consisting of a major cluster and two diagonally opposed minor clusters relative to said major circle.

18. The method for photolithographically developing a photoresist according to claim 10 wherein
  (a) said optical mask has a cigar-shaped two-dimensional bandwidth distribution in a Fourier transformed frequency domain;
  (b) said first grating has a bandwidth distribution consisting of a major cluster and two diagonally opposed minor clusters relative to said major circle in said Fourier transformed frequency domain, and
  (c) said first grating and optical mask are structured such that an incident light is convoluted between said first grating and said optical mask and the bandwidth of the convoluted spectrum comprises one said cigar-shaped distribution, plus two identical clones respectively centered at said two minor clusters.

* * * * *